(12) United States Patent
Zhai et al.

(10) Patent No.: US 7,303,110 B2
(45) Date of Patent: Dec. 4, 2007

(54) FLANGE-MOUNTED TRANSDUCER

(75) Inventors: Bao Nian Zhai, Singapore (SG); Ka Shing Kenny Kwan, Singapore (SG)

(73) Assignee: ASM Technology Singapore Pte Ltd., Singapore (SG)

( * ) Notice: Subject to any disclaimer, the term of this patent is extended or adjusted under 35 U.S.C. 154(b) by 191 days.

(21) Appl. No.: 10/875,659

(22) Filed: Jun. 23, 2004

(65) Prior Publication Data

US 2005/0284912 A1    Dec. 29, 2005

(51) Int. Cl.
*B23K 1/06* (2006.01)
(52) U.S. Cl. .......................................... 228/1.1; 228/4.5
(58) Field of Classification Search ................ 228/1.1, 228/110.1, 180.5, 4.5
See application file for complete search history.

(56) References Cited

U.S. PATENT DOCUMENTS

| | | | | | |
|---|---|---|---|---|---|
| 3,955,740 | A | * | 5/1976 | Shoh ........................... | 228/1.1 |
| 5,364,005 | A | * | 11/1994 | Whelan et al. ............... | 228/1.1 |
| 5,377,894 | A | * | 1/1995 | Mizoguchi et al. .......... | 228/1.1 |
| 5,595,328 | A | * | 1/1997 | Safabakhsh et al. ......... | 228/1.1 |
| 5,699,953 | A | * | 12/1997 | Safabakhsh .............. | 228/110.1 |
| 5,772,100 | A | * | 6/1998 | Patrikios ..................... | 228/1.1 |
| 5,816,476 | A | * | 10/1998 | Buice et al. ................. | 228/102 |
| 5,921,457 | A | * | 7/1999 | Patrikios ..................... | 228/1.1 |
| 6,070,777 | A | * | 6/2000 | Patrikios et al. ............. | 228/1.1 |
| 6,135,339 | A | | 10/2000 | Parrini ...................... | 228/1.1 |
| 6,286,747 | B1 | * | 9/2001 | Chan et al. .................. | 228/1.1 |
| 6,871,770 | B2 | * | 3/2005 | Li et al. ...................... | 228/1.1 |
| 2003/0000994 | A1 | * | 1/2003 | Kyomasu et al. ............ | 228/1.1 |
| 2003/0062395 | A1 | * | 4/2003 | Li et al. ...................... | 228/4.5 |

OTHER PUBLICATIONS

Flange, http://dictionary.reference.com/browse/flange.*

* cited by examiner

*Primary Examiner*—Kiley Stoner
(74) *Attorney, Agent, or Firm*—Ostrolenk, Faber, Gerb & Soffen, LLP

(57) ABSTRACT

A flange-mounted transducer, such as an ultrasonic transducer, is provided that comprises a horn and a driver coupled to the horn for generating an oscillatory energy supply to the horn. A support structure interface is positioned at a node of longitudinal oscillatory displacement of the transducer and a support structure spaced from the horn extends from the support structure interface in a direction substantially parallel to a longitudinal axis of the horn. A flange mounted to the support structure at a node of radial oscillatory displacement of the support structure allows the transducer to be mounted to a machine, such as an ultrasonic wire-bonding machine, at a mounting position so that minimal vibration is transmitted from the transducer to the mounting position.

9 Claims, 2 Drawing Sheets

FLANGE-MOUNTED TRANSDUCER

FIELD OF THE INVENTION

The invention relates to a transducer for generating bonding energy to a surface of interest, such as a bond pad of an electronic device during ultrasonic wire bonding.

BACKGROUND AND PRIOR ART

During the production of electronic devices, there is sometimes a need to mount an integrated circuit die or chip onto a carrier. After mounting, electrical connections are made between the chip and the carrier before the product is molded into a semiconductor package, typically by the use of bonding wires. These bonding wires may be attached to bond pads on the chip and the carrier respectively by ultrasonic welding using an ultrasonic transducer.

The ultrasonic transducer is integrated into a wire-bonding machine. Since very fine wires and bond pitches are involved, the manner in which the ultrasonic transducer is mounted to the wire-bonding machine is very important. For example, if the ultrasonic transducer is mounted such that vibrations from the transducer are transferred to a mounting bracket, ultrasonic energy loss can result. If there is excessive vibration, the transducer characteristics, such as its frequency spectrum characteristics, may be changed, thereby affecting the stability of the transducer. Furthermore, the impedance of the transducer may change unpredictably, making it harder to control. Therefore, it is important to mount the ultrasonic transducer such that vibration generated during ultrasonic bonding is isolated to the transducer itself, and as far as possible, these vibrations are not transmitted to the rest of the wire-bonding machine.

In the case of a flange-mounted ultrasonic transducer, one way in which vibration to the wire-bonding machine can be minimized is disclosed in U.S. Pat. No. 6,135,339 for "Ultrasonic Transducer with a Flange for Mounting on an Ultrasonic Welding Device, in particular on a Wire Bonder". This patent teaches locating the flange on a nodal point of the longitudinal vibration of the horn, and also forming the flange with a sufficient length such as to introduce a nodal point for radial vibration of the horn so as to locate a mounting point at the said radial nodal point. The ultrasonic transducer is mounted at the positions of these radial nodal points so that vibrations at the mounting positions are the lowest possible, and thereby reducing the transmission of vibration to the wire-bonding machine to which the transducer is mounted.

The problem with this approach is that the length of the flange may be lengthened in order to establish the said radial nodal point, as recognized in the patent disclosure itself. This modification is not desirable as more space is consequently required in the wire-bonding machine to locate the ultrasonic transducer, whereas it would be more desirable to make the components of the wire-bonding machine as compact as possible. Furthermore, using this approach still serves to impart significant vibration to the mounting because although the flange is located at a radial nodal point, the material of the flange is considerably larger than the nodal point itself. As a result, the effectiveness of the method is reduced.

SUMMARY OF THE INVENTION

It is thus an object of the invention to provide a flange-mounted ultrasonic transducer that minimizes the transmission of vibration from the ultrasonic transducer to the wire-bonding machine to which it is mounted while overcoming some of the disadvantages of the aforesaid prior art.

Accordingly, the invention provides a flange-mounted transducer comprising: a horn; a driver coupled to the horn for generating an oscillatory energy supply to the horn; a support structure interface positioned at a node of longitudinal oscillatory displacement of the transducer; a support structure spaced from the horn and extending from the support structure interface in a direction substantially parallel to a longitudinal axis of the horn; and a flange mounted to the support structure at a node of radial oscillatory displacement of the support structure.

It would be convenient hereinafter to describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

An example of a flange-mounted ultrasonic transducer in accordance with the invention will now be described with reference to the accompanying drawings, in which.

DETAILED DESCRIPTION OF THE PREFERRED EMBODIMENT

Figure 1:
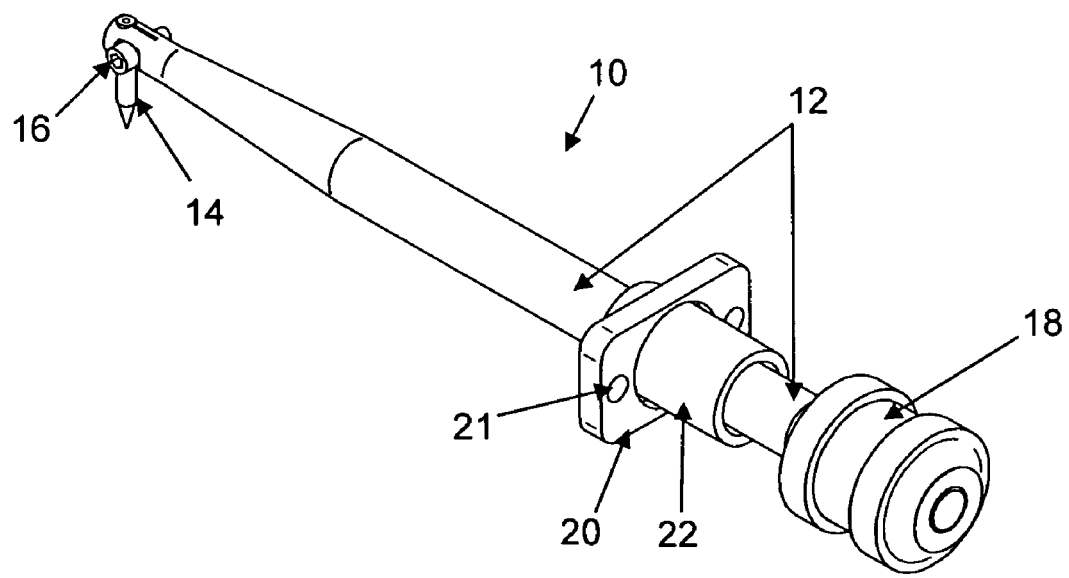
FIG. 1 is an isometric view of a transducer according to the preferred embodiment of the invention.

FIG. 1 is an isometric view of a transducer 10, such as a transducer mounted onto a wire-bonding machine, according to the preferred embodiment of the invention. The transducer 10 comprises generally of a horn 12 with a capillary 14 mounted on one end of the transducer 10 using a capillary screw 16. A driver, which may be in the form of a piezoelectric stack 18, is coupled to the horn 12 for generating an oscillatory energy supply, such as ultrasonic energy to the tip of the capillary 14 through the horn 12 during ultrasonic welding. The piezoelectric stack 18 is driven to vibrate at ultrasonic frequencies when an electric current is applied to it, causing oscillation of the transducer 10. The horn 12 is mountable onto a wire-bonding machine (not shown) via one or more mounting holes 21 formed on a flange 20 coupled to the horn 12. The mounting holes 21 may be adapted to receive screws for said purpose of mounting. The flange 20 is preferably formed on a support structure, preferably in the form of a barrel 22 that surrounds a portion of the horn 12 at an area where the transducer 10 is to be mounted to the wire-bonding machine.

Figure 2:
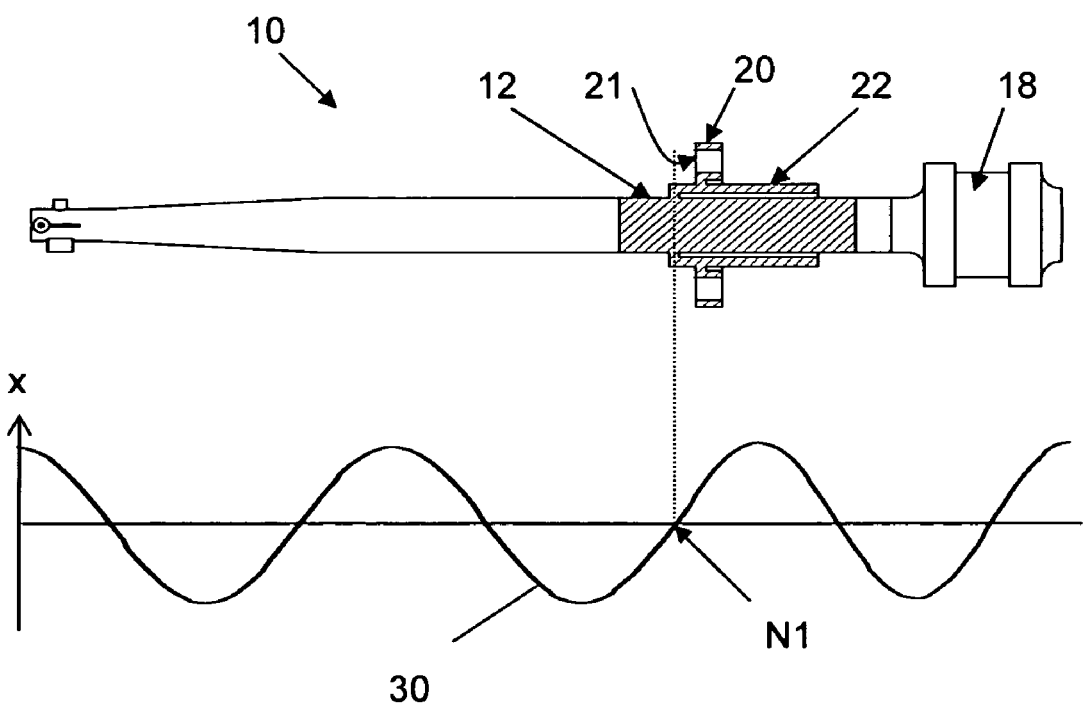
FIG. 2 is a cross-sectional plan view of the transducer of FIG. 1 including a graph illustrating longitudinal displacement of the transducer along its length during operation.

FIG. 2 is a cross-sectional plan view of the transducer 10 from the top of FIG. 1, including a graph 30 illustrating longitudinal displacement (x) of the transducer 10 along its length during operation. At a selected operational frequency of the transducer 10, a certain profile of vibrational displacement at each position along the length of the transducer 10 is created. As shown in FIG. 2, there are certain positions at which longitudinal displacement is greatest, and other positions at which there is minimal longitudinal displacement, such as at nodal position N1.

It is preferred that the barrel 22 is connected to the horn 12 at a point where there is minimal longitudinal displacement, such as at the nodal position N1, where there is a node of longitudinal oscillatory displacement. Although the barrel 22 is arranged substantially parallel to and surrounds the horn 12 at other positions along the length of the horn 12, it does not touch the horn 12 at these other positions. It is connected to the horn 12 only at a support structure or barrel interface of the transducer 10. In fact, by connecting the barrel 22 to the horn 12 at a longitudinal vibration nodal position N1, the amount of longitudinal vibration that is transmitted to the barrel 22 is much reduced. Likewise, since the flange 20 is connected only to the barrel 22 and is therefore mechanically decoupled from the horn 12, the amount of longitudinal vibration that can be transmitted to the mounting holes 21 of the flange 20 at the mounting position is also substantially reduced. Nevertheless, although longitudinal vibration at the mounting holes 21 has been substantially reduced, it is also advantageous to reduce the magnitude of radial vibration at the mounting holes 21.

Figure 3:
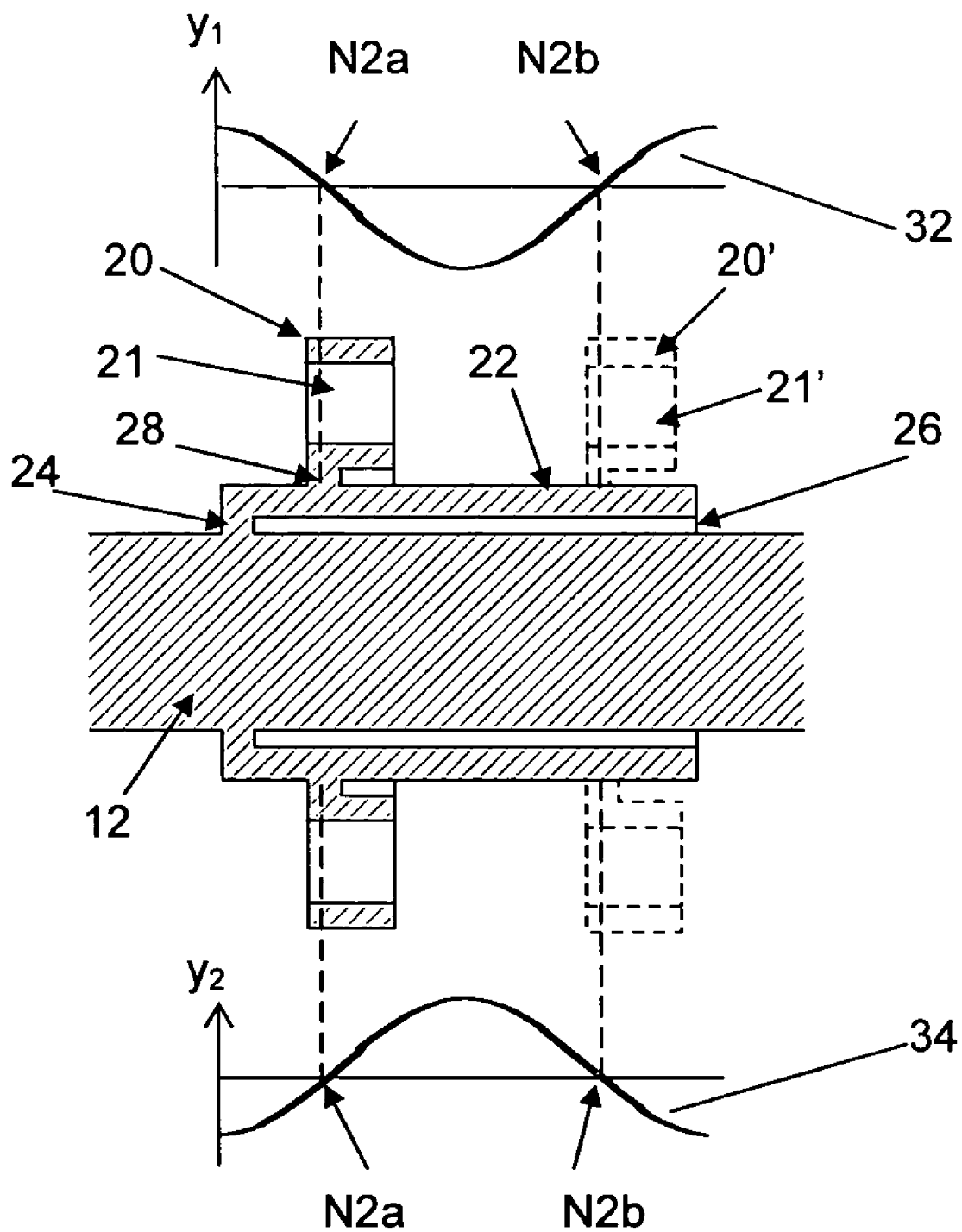
FIG. 3 is an enlarged cross-sectional plan view of the shaded part of the transducer in FIG. 2, and graphs illustrating radial displacement of the transducer along its length during operation.

FIG. 3 is an enlarged cross-sectional plan view of the shaded part of the transducer 10 in FIG. 2, and graphs 32, 34 illustrating radial displacement of the transducer 10 along its length during operation. FIG. 3 shows more clearly that the barrel 22 is connected to the horn 12 only at the support structure interface or barrel interface 24, while the flange 20 is connected to the barrel 22 at a flange interface 28. The flange interface 28 has a smaller cross-sectional area along the longitudinal axis of the transducer 10 as compared to the body of the flange 20. As described above, the barrel interface 24 is located at a nodal point N1 for longitudinal oscillatory displacement, whereas the rest of the barrel 22 is not in contact with the horn 12, leaving a gap 26 between the barrel 22 and the horn 12 to mechanically decouple the flange 20 from the horn 12. Therefore, longitudinal oscillation of the barrel 22 is substantially reduced. Nevertheless, a profile for radial oscillation of the transducer 10 is different from its profile for longitudinal oscillation, so that the barrel 22 is still subjected to radial oscillation.

Graph 32 shows the radial oscillation displacement $y_1$ of a flange 20 on one side of the transducer 10 and graph 34 shows the radial oscillation displacement $y_2$ of a flange on an opposite side of the transducer 10. Since these flanges 20 are arranged symmetrically, the profiles of the graphs are also generally symmetrical. From the graphs 32, 34, one notes that there are two positions along the barrel 22 where there are nodal points N2a, N2b for radial oscillatory displacement, where there is minimal radial displacement or oscillation.

It is thus preferred that the flange 20 be mounted onto the barrel 22 at a nodal point for radial oscillation. Accordingly, the flange interface 28 is located at one of the nodal points N2a, N2b. In FIG. 3, the flange 20 and mounting hole 21 are connected to the barrel 22 through the flange interface 28 at nodal point N2a, although it would be appreciated that the flange 20' and mounting hole 21' respectively could also be connected to the barrel 22 at the other nodal point N2b, or flanges 20, 20' could be connected at both nodal points N2a, N2b for mounting.

Further, it is preferred that each mounting hole 21 is positioned at a location on the flange 20 where both longitudinal and radial oscillatory displacements are at a minimum.

It would be appreciated that the barrel 22 should be formed of a sufficient length to locate at least one nodal point along its surface. It may also be configured to be of sufficient length to include more than one node of radial oscillatory displacement. However, as distinct from the prior art described above, this length of material does not run perpendicular to the longitudinal axis of the transducer 10, but runs parallel to the longitudinal axis of the transducer 10.

Furthermore, since the flange 20 is connected through a nodal point N1 for longitudinal oscillatory displacement, and a nodal point N2a, N2b for radial oscillatory displacement of the horn 12, any vibration transmitted to the mounting holes 21 can be substantially decreased without having to substantially increase the size of the flanges 20 as compared to the prior art. Hence, it would be appreciated that the size of the flange 20 can be designed so that it is not much larger than the size required for the mounting hole 21, and this leads to space savings on the wire-bonding machine.

The invention described herein is susceptible to variations, modifications and/or additions other than those specifically described and it is to be understood that the invention includes all such variations, modifications and/or additions which fall within the spirit and scope of the above description.

The invention claimed is:

1. A flange-mounted transducer comprising:
   a horn;
   a driver coupled to the horn for generating an oscillatory energy supply to the horn;
   a support structure interface positioned at a node of longitudinal oscillatory displacement of the transducer;
   a support structure spaced from the horn and extending from the support structure interface in a direction substantially parallel to a longitudinal axis of the horn, the support structure being connected to the horn only at the support structure interface; and
   a flange mounted to the support structure at a node of radial oscillatory displacement of the support structure, wherein the node of radial oscillatory displacement is positioned along the longitudinal length of the support structure, the longitudinal length of the support structure being substantially parallel to the longitudinal axis of the horn, and wherein the node of radial oscillatory displacement is distanced from the support structure interface along the longitudinal length.

2. The flange-mounted transducer as claimed in claim 1, wherein the support structure comprises a barrel surrounding a portion of the horn.

3. The flange-mounted transducer as claimed in claim 1, wherein the support structure is configured to be of sufficient length to include more than one node of radial oscillatory displacement.

4. The flange-mounted transducer as claimed in claim 1, wherein the flange includes one or more mounting holes for mounting the transducer.

5. The flange-mounted transducer as claimed in claim 4, wherein each mounting hole is positioned at a location on the flange where the longitudinal and radial oscillatory displacements are at a minimum.

6. The flange-mounted transducer as claimed in claim 1, wherein the flange is connected to the support structure at a flange interface.

7. The flange-mounted transducer as claimed in claim 6, wherein the flange interface has a smaller cross-sectional area along a longitudinal axis of the transducer than a body of the flange.

8. The flange-mounted transducer as claimed in claim 1, wherein the driver imparts ultrasonic energy to the horn.

9. The flange-mounted transducer as claimed in claim 1, wherein the transducer is mounted to a wire-bonding machine.

* * * * *